(12) United States Patent
Saitoh

(10) Patent No.: US 6,397,361 B1
(45) Date of Patent: May 28, 2002

(54) REDUCED-PIN INTEGRATED CIRCUIT I/O TEST

(75) Inventor: Toshiharu Saitoh, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/285,911

(22) Filed: Apr. 2, 1999

(51) Int. Cl.[7] ............................ G01R 31/28; G11C 7/00
(52) U.S. Cl. .................. 714/724; 714/733; 714/734; 324/73.1; 324/158.1; 324/765; 365/201; 365/218; 365/230.06
(58) Field of Search .................. 714/724, 719, 714/733, 734, 736; 324/73.1, 158.1, 763, 765; 326/30, 90; 327/108, 563; 365/201, 218, 230.06; 713/1

(56) References Cited

U.S. PATENT DOCUMENTS

| | | | |
|---|---|---|---|
| 3,976,940 A | 8/1976 | Chau et al. | 714/736 |
| 5,155,733 A | 10/1992 | Blecha, Jr. | 714/733 |
| 5,166,937 A | 11/1992 | Blecha, Jr. | 714/733 |
| 5,220,673 A | 6/1993 | Dalrymple et al. | 713/1 |
| 5,414,352 A * | 5/1995 | Tanase | 324/158.1 |
| 5,568,493 A | 10/1996 | Morris | 714/726 |
| 5,577,052 A | 11/1996 | Morris | 714/733 |
| 5,659,514 A | 8/1997 | Hazani | 365/218 |
| 5,942,922 A * | 8/1999 | Dinteman et al. | 327/108 |
| 6,008,664 A * | 12/1999 | Jett et al. | 324/765 |
| 6,020,752 A * | 2/2000 | Shimasaki | 324/765 |

* cited by examiner

Primary Examiner—Emmanuel L. Moise
(74) Attorney, Agent, or Firm—William N. Hogg

(57) ABSTRACT

The present invention provides a method and device for reduced-pin integrated circuit I/O testing. In this regard, the present invention provides for the testing of an integrated circuit or chip in a manner which is independent of the number of test pins present on the testing device. The method and device of the present invention are realized through an integrated circuit having two test ports: a scannable I/O test port and a Forcing-Measuring test port, and a plurality of switches. The scannable I/O test port is employed for the input and output of, among other things, scannable shift-register latch data which affects the states of the plurality of switches in the integrated circuit. The Forcing-Measuring test port is employed for, among other things, forcing or measuring voltages and currents associated with the I/O circuits under test through the switches to the circuits under test. The methods of the present invention are embodied in a plurality of test configurations including: an I/O Short-Circuit test configuration which verifies that each I/O is not short-circuited to a supply voltage or to ground; an I/O Negative and Positive Leakage test configuration; a Pull-Up and Pull-Down Resistor test configuration; Differential I/O test configuration; a Package test configuration; an I/O Driver Least Positive Up Level (LPUL) and Most Positive Down Level (MPDL) test configuration; a single-ended I/O receiver LPUL and MPDL test configuration; a differential I/O receiver LPUL and MPDL test configuration; and Differential I/O Terminator Resistor Test configuration.

28 Claims, 12 Drawing Sheets

REDUCED-PIN INTEGRATED CIRCUIT I/O TEST

FIELD OF THE INVENTION

The invention relates generally to the testing of integrated circuits, and more particularly, to methods and apparatuses for testing the input/output characteristics of an integrated circuit.

BACKGROUND OF THE INVENTION

Integrated circuits such as, for example, Application Specific Integrated Circuits (i.e., ASICs), are constantly evolving with advances in functionality and performance. With increases in functionality and performance, there is a greater need than ever to test an integrated circuit for proper functionality. Of particular testing importance is whether the chip or die which is the integrated circuit is a known good die. However, advances in functionality and performance of integrated circuits has made it increasingly difficult to perform such tests.

One area of particular testing importance is the proper functionality of an integrated circuit's input/output (i.e., I/O) circuitry. Specifically, for a known good die to be established, each I/O circuit must be tested for proper functionality before the known good die is embedded into a package. Accordingly, if the integrated circuit contains 256 I/O, each of the 256 I/O must be tested. Similarly, if the integrated circuit contains 512 I/O, each of the 512 I/O must be tested. Such testing is generally accomplished via testing equipment which includes a sufficient number of test elements for connection to each I/O. For example, to test an integrated circuit with 256 I/O, the test equipment would need at least 256 test elements, one test element for each I/O. However, if the integrated circuit to be tested includes 512 I/O, the same piece of test equipment may not have 512 test elements and, therefore, lacks capacity to test such an integrated circuit. Consequently, as the number of I/Os in an integrated circuit increases, the ability of existing test equipment to test such integrated circuits is limited by the number of test elements possessed by the testing equipment. Therefore a method of testing integrated circuits which does not particularly depend on the type of testing equipment is highly desirable.

SUMMARY OF THE INVENTION

The present invention provides a method and device for reduced-pin integrated circuit I/O testing. In this regard, the present invention provides for the testing of an integrated circuit or chip in a manner which is independent of the number of test elements present on the testing device. This is accomplished by the present invention by providing a method for testing a chip having the steps of: providing a plurality of switches on the chip which are associated with a plurality of input/output circuits on the chip; selectively changing the state of a pre-determined number of the plurality of switches from a first state to a second state; applying a test condition to a predetermined number of the plurality of input/output circuits on the chip through the plurality of switches; applying a test condition to the predetermined number of the plurality of input/output circuits on the chip through the plurality of switches; and measuring a resultant condition from the predetermined number of input/output circuits to determine if any of the predetermined number of input/output circuits on the chip are faulty.

Various embodiments of the present invention are disclosed in the form of a plurality of test configurations which test specific operational features or components of the integrated circuit's I/O circuitry. In this regard, the present invention discloses an integrated circuit having two test ports: a scannable I/O test port and a Forcing-Measuring test port. The scannable I/O test port is employed for the input and output of, among other things, scannable shift-register latch data which affects the states of the plurality of switches in the integrated circuit. The Forcing-Measuring test port is employed for, among other things, forcing or measuring voltages and currents associated with the I/O circuits under test.

The various I/O test configurations of the present invention are embodied in one or more of the following tests: an I/O Short-Circuit test configuration which verifies that each I/O is not short-circuited to a supply voltage or to ground; an I/O Negative and Positive Leakage test configuration; a Pull-Up and Pull-Down Resistor test configuration; Differential I/O test configuration; a Package test configuration; an I/O Driver Least Positive Up Level (LPUL) and Most Positive Down Level (MPDL) test configuration; a single-ended I/O receiver LPUL and MPDL test configuration; a differential I/O receiver LPUL and MPDL test configuration; and Differential I/O Terminator Resistor Test configuration.

It is therefore an advantage of the present invention to provide a method of testing an integrated circuit's I/O circuitry by using only a limited number of pins, regardless of the number of integrated circuit I/O circuitry required to be tested.

It is a further advantage of the present invention to provide a method of testing an integrated circuit's I/O circuitry without all of the I/O circuitry being connected to the testing device.

It is still a further advantage of the present invention to provide an integrated circuit which can be tested through a limited number of external connections, regardless of the number of circuits required to be tested.

BRIEF DESCRIPTION OF THE DRAWINGS

In the accompanying drawings which are incorporated in and constitute a part of the specification, embodiments of the invention are illustrated, which, together with a general description of the invention given above, and the detailed description given below, serve to example the principles of this invention.

DETAILED DESCRIPTION OF THE ILLUSTRATED EMBODIMENTS

Figure 1A:
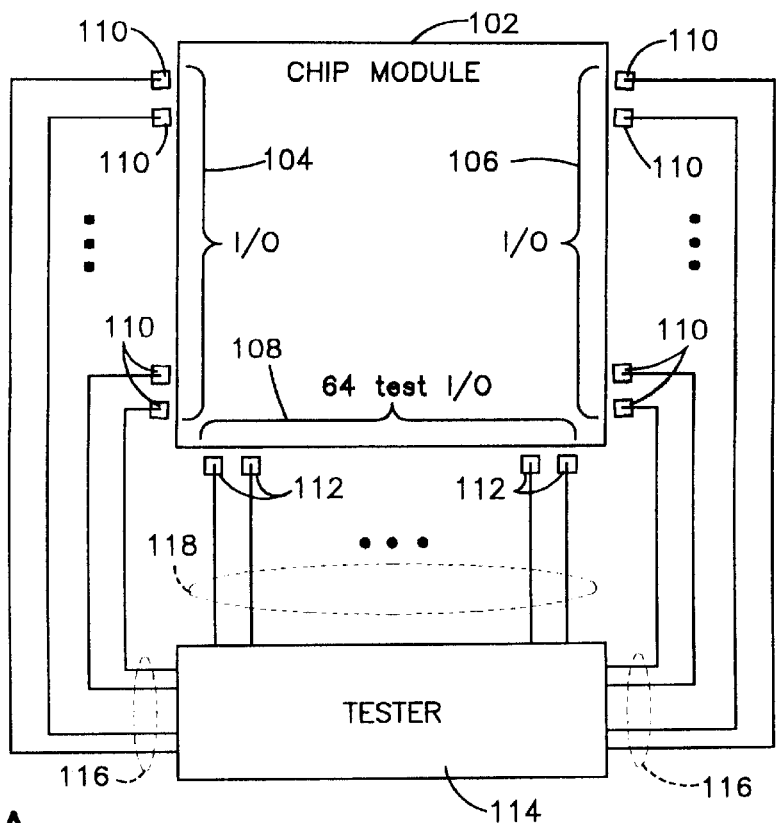
FIGS. 1A and 1B are block diagrams of prior art testing structures.

Referring now to the drawings, FIG. 1A illustrates a prior art testing configuration 100 having a chip or module 102 and tester 114. The chip 102 includes a plurality I/O generally indicated at 104, 106, and 108. Chip I/O indicated generally at 104 and 106 have electrical contact pads associated therewith which are generally indicated at 110. The chip I/O generally indicated at 108 have electrical contact pads also associated therewith which are generally indicated at 112. The chip I/O generally indicated at 104 and 106 are part of the chip's general purpose I/O. The chip I/O generally indicated at 108 are specific test I/O which are used during the testing of the chip 102 internal circuits by the tester 114 to input and output particular test information. The tester 114 also includes a plurality of I/O which are required to make electrical contact with the chip 102 via electrical connections 116 and 118. Accordingly, for tester 114 to correctly test chip 102, tester 114 must have enough test I/O to make electrical contact with I/O on the chip 102. For example, if chip 102 has 512 I/O, tester 114 must have at least 512 test I/O available.

Figure 1B:
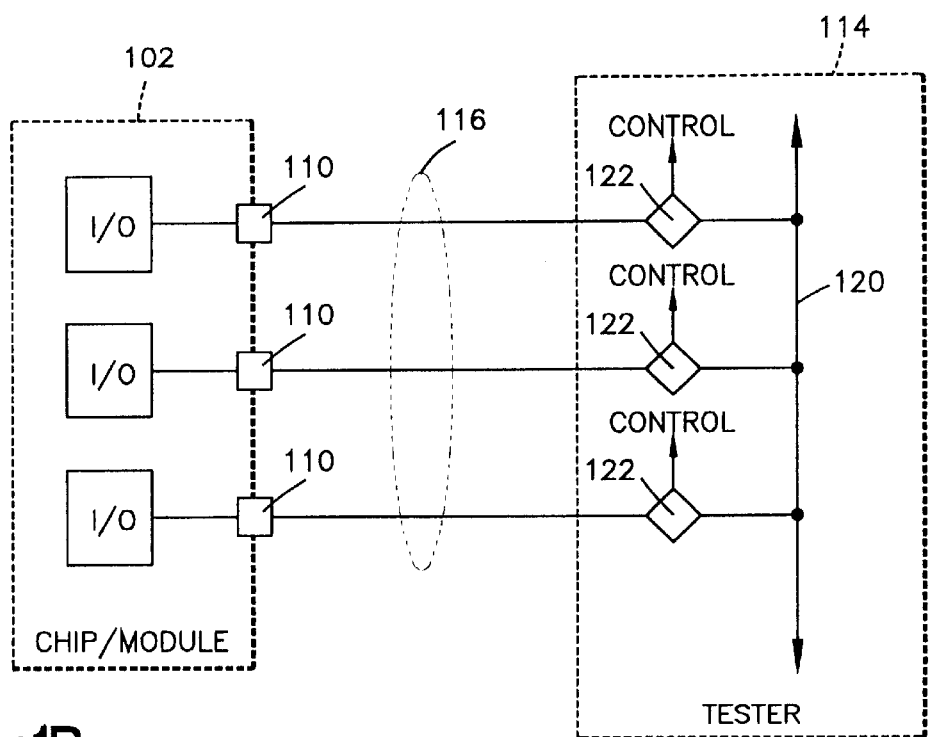

Referring now to FIG. 1B, an example diagram illustrating certain components of the prior art testing configuration 100 of FIG. 1A is shown. Specifically, each general I/O of tester 114 includes a plurality of switches 122 which are connected a test bus 120. Each of the plurality of switches 122 interconnects the test bus 120 with an electrical contact pad 110 on the chip 102 via electrical connections 116. Each of the plurality of switches 122 is also connected to a control signal generated by the test control logic (not shown) of tester 114. Accordingly, the function of each switch of the plurality of switches 122 is to effect testing of a particular chip 102 I/O via the state of the control signal associated with the switch. Therefore, for each chip I/O which is required for testing, the tester 114 must have an addressable switch 122 that allows particular selection of the I/O to be tested. Hence, the tester 114 is required to have at least as many test I/O elements and switches as the number of I/O on the chip 102 to be tested.

Figure 2A:
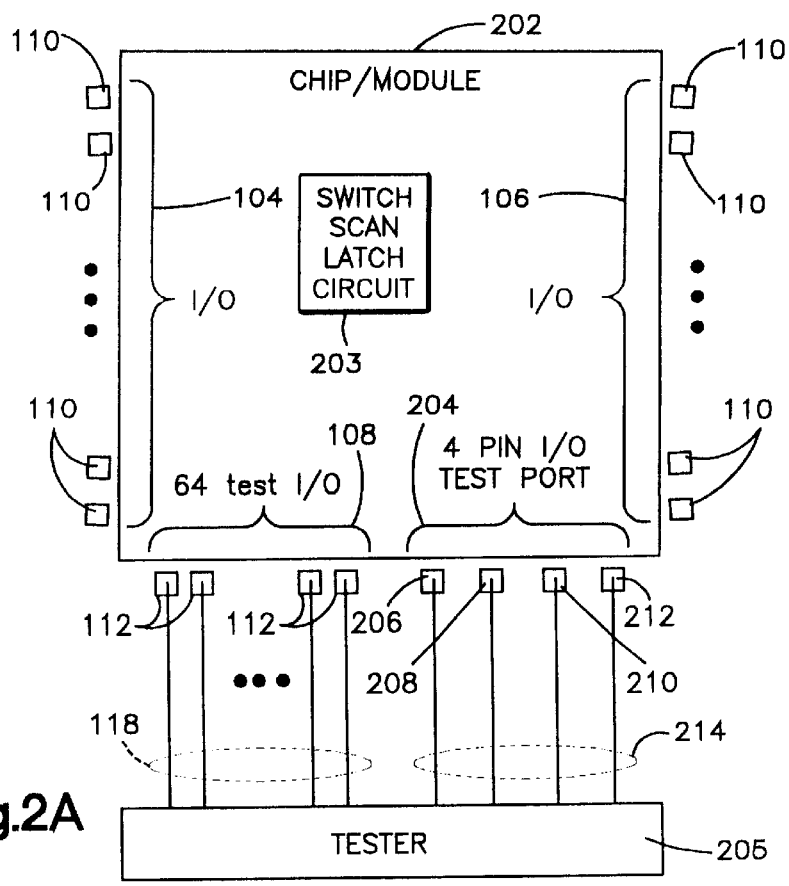
FIG. 2A is a block diagram of one embodiment of the system of the present invention.

Illustrated in FIG. 2A is a block diagram of one embodiment of a testing system 200 of the present invention. The testing system 200 includes a chip 202 to be tested and a tester 205. The chip 202 includes a plurality of I/O generally indicated at 104 and 106. The chip 202 also includes a switch scan latch circuit 203, a plurality of test I/O 108, and a Forcing-Measuring test port 204. The test I/O 108 have a plurality of associated electrical contact pads 112. The test I/O 108 form a scannable I/O test port employed by the tester 205 for functions such as, for example, the input and output of addressable I/O test latch data which can be used to set particular I/O test latches, or to read the state of an addressable I/O test latch(s) by scan-in or scan-out data operations. Such scannable I/O test ports are conventional and include approximately 64 I/O.

The test port 204 has a plurality of electrical contact pads representing the following test port I/O: FM True 206, FM Complement 208, I/O Self-Test 210, and Enable Switch 212. As will be described in more detail hereinafter, the scannable I/O 108 and the test port 204 enable tester 205 to test all of the I/O present on chip 202 without having to provide an external electrical connection to each I/O as shown in the prior art FIG. 1A. Consequently, tester 205 is not physically limited to testing chips based on the number of external electrical connections tester 205 can make with a chip's external I/O.

Figure 2B:
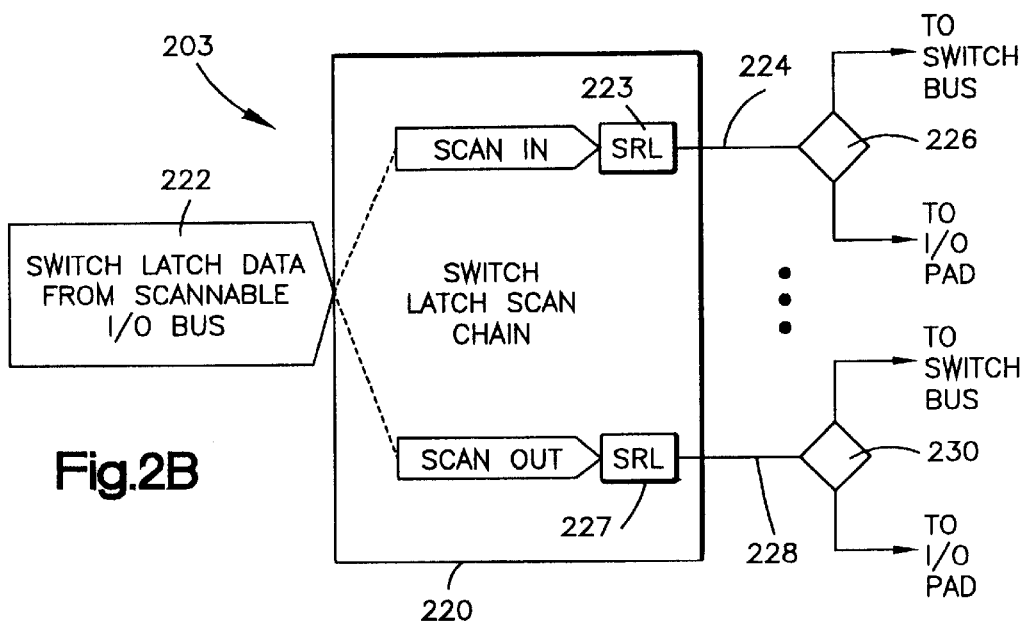
FIG. 2B is a block diagram of one embodiment of a switch latch circuit of the present invention.

Referring now to FIG. 2B, a switch scan latch circuit 203 of the present invention is shown. The switch scan latch circuit 203 is preferably in the form of a scan chain 220 of shift-register latches (e.g., 223 and 227) which receives switch latch data elements 222 (i.e., binary bit information) and sets the latches to activate or deactivate one or more latch control signals (e.g., 224, 228). The switch latch control signals 224 and 228 function to control the state (i.e., open or closed) of switches 226 and 230. Alternatively, an N×M decoder may be substituted for the scan chain 220 which accepts N bits of switch latch data 222 and activates M switch latch control signals, where M is equal to the number of switches and N is at least large enough to represent all combination of states of M.

It should be noted hereinafter that only a limited number of switches (i.e., 226 and 230) have been shown for simplicity. In actuality, the number of switches preferably equals the number of I/O on the chip being tested. Similarly, each switch has a switch latch control signal associated therewith. Additionally, each switch is connected to a switch bus and to an electrical pad associated with the I/O. Accordingly, switch latch data 222 is sent to the switch scan latch scan chain 220 to effectuate changes in the states of the plurality of switches (e.g., 226, 230) on the chip to be tested. The changes in switch state serve to connect or disconnect a particular I/O on the chip from the common switch bus. As will be described in the various testing embodiments of the present invention, the switch bus, in combination with the switch latch circuit 203, allows for selective internal electrical connections to be made to each I/O on the chip through the switch latch data 222. The switch bus itself is connected to the FM True and/or FM Complement I/O of the test port 204 for forcing and measuring true and/or complement test signals into the I/O being tested (i.e., single-end I/O—only FM True; differential I/O—FM True and Complement).

The present discussion will now focus on the various test configurations which can be performed on the I/O of the chip being tested as embodied by the present invention. For the sake of simplicity, the detailed discussion of the embodiments which follow hereinafter have been limited to the example of one or two (2) I/O under test. However, it should be understood that the detailed discussion of each embodiment is applicable to whatever number of I/O are actually on the chip to be tested.

I/O Short-Circuit Test

Figure 3:
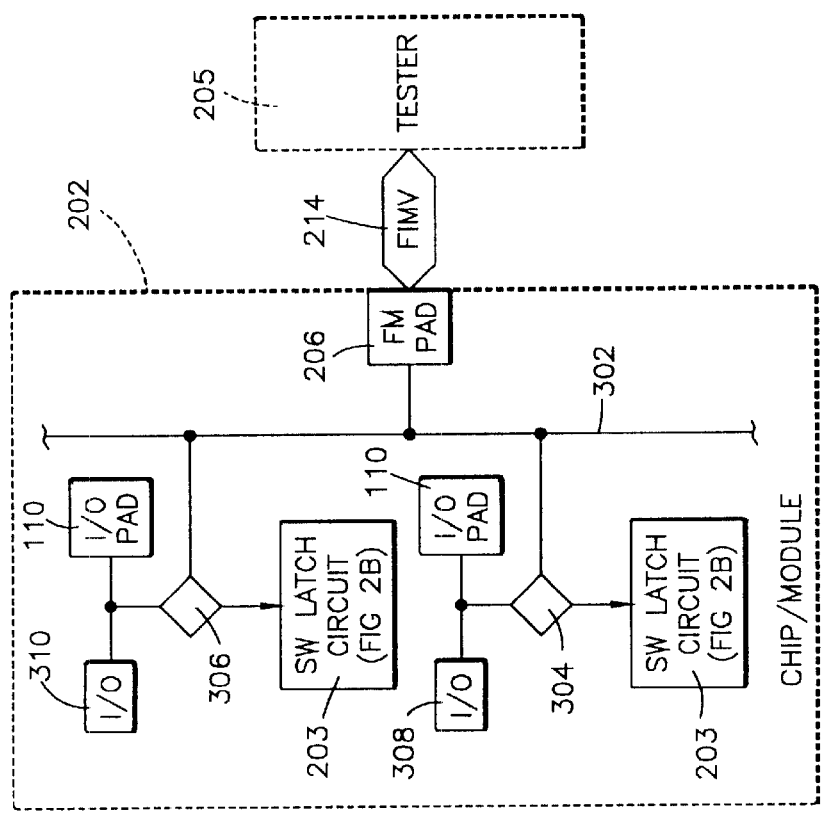
FIG. 3 is a block diagram illustrating an I/O Short-Circuit test configuration of the present invention.

Accordingly, illustrated in FIG. 3 is a block diagram showing an I/O Short-Circuit test configuration of the present invention. The I/O Short-Circuit test of FIG. 3 is performed to verify that each I/O is not short-circuited to a supply voltage or to ground. Specifically, chip 202 is connected to tester 205 at the FM True I/O 206 electrical pad via connection 214. The FM True I/O 206 electrical pad is connected to switch bus 302 which is in turn connected to switches 304 and 306. Switches 304 and 306 are connected to chip I/O circuits 308 and 310 and their respective contact pads 110 and to the switch latch circuit 203 of FIG. 2B.

In operation, tester 205 inputs switch latch data corresponding to a particular switch (e.g., 304) to change the state of the switch from an open state to a closed state. With switch 304 in a closed state, the FM True 206 I/O pad is now in circuit communication with chip I/O 308 through switch bus 302 and closed switch 304. Since all other switches (e.g., 306) are in the open state, chip I/O 308 is the only chip I/O in circuit communication with tester 205. With such a configuration, after all of the chip I/O drivers are tri-stated (i.e., completely open), tester 205 forces a small current into chip I/O 308 and measures the voltage associated with the forced current. This practice of forcing a current and measuring the associated voltage is represented by the acronym "FIMV" in the drawings. Consequently, if the measured voltage associated with the forced current is zero, very nearly zero, or below a predetermined threshold voltage, such measured voltage is indicative of a short-circuit to ground in the chip I/O 308. On the other hand, if the measured voltage associated with the forced current is equal to the power supply voltage, or very nearly equal thereto, such measured voltage is indicative of a short circuit to the supply voltage in the chip I/O 308. The same procedure is then performed on chip I/O 310 via switch 306 and tester 205 with other switches disconnecting their respective chip I/O from tester 205.

This procedure is performed on each I/O one at a time until all of the chip I/O have been tested. As described above, this is accomplished by setting the state of a particular switch associated with a particular chip I/O to a closed state while setting the states of the remaining switches to the open state so that only desired chip I/O are in circuit communication with the tester. In this manner, each chip I/O is tested for a short-circuit.

I/O Negative and Positive Leakage Test

Figure 4:
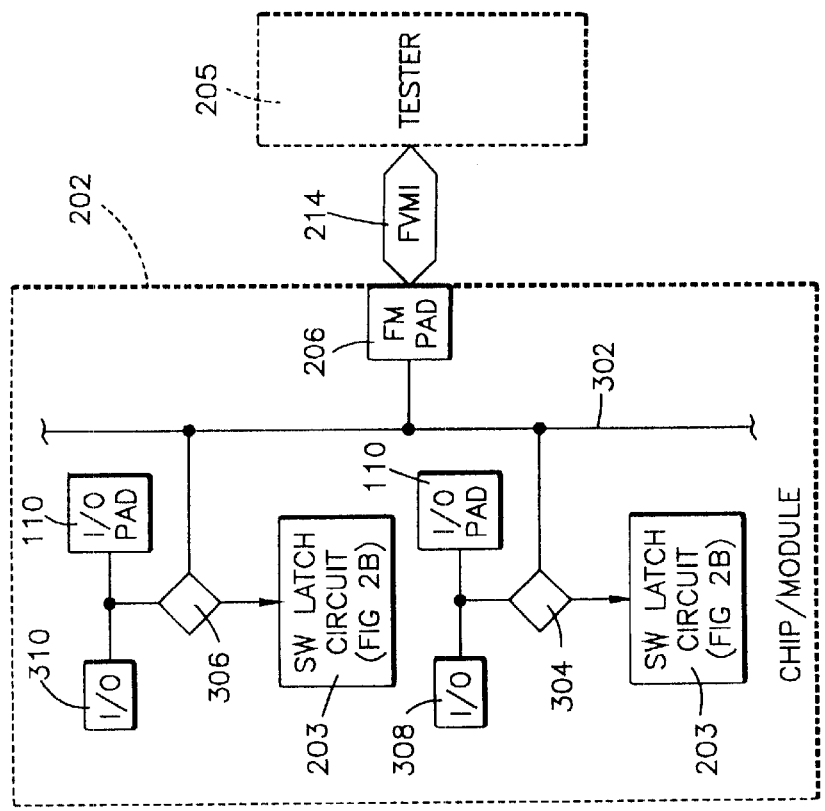
FIG. 4 is a block diagram illustrating an I/O Negative and Positive Leakage test configuration of the present invention.

Referring now to FIG. 4, an I/O Negative and Positive Leakage test configuration of the present invention is shown. The physical configuration is identical to that of the Short-Circuit test configuration of FIG. 3. However, the testing procedure is different. Specifically, the tester 205 inputs switch latch data which changes the state of all switches from an open state to a closed state thereby placing all chip I/O in circuit communication with the tester 205. Therefore, in FIG. 4, switches 304 and 306 are placed in the closed state thereby connecting chip I/O 308 and 310 to tester 205. After all of the chip I/O drivers are tri-stated (i.e., completely open), tester 205 forces a voltage through connection 214 to the FM True I/O 206 electrical pad and ultimately to chip I/O 308 and 310 through switch bus 302 and switches 304 and 306. As tester 205 forces a voltage into the chip I/O, the current associated with the forced voltage is measured. If the measured current is above or below a predetermined current level (depending on whether a positive or negative voltage is being forced), the leakage exists in one or more of the chip I/O. To determine which particular chip I/O(s) is causing the leakage, each individual chip I/O must be tested for leakage. In this situation, the tester 205 inputs switch latch data setting the state of one particular switch to the closed state and all other switches to the open state thereby only placing one chip I/O in circuit communication with the tester 205. Tester 205 then forces a voltage into the particular chip I/O through the FM True I/O electrical pad, switch bus, and the closed switch, and measures the associated current. This procedure is performed on each chip I/O until all of the I/O have been tested for leakage to determine which I/O are faulty.

Accordingly, the I/O Positive and Negative Leakage test is necessarily a two-part test. The first part entails placing each chip I/O in circuit communication with the tester through the switch bus and forcing a voltage into all of the chip I/O and measuring the associated current. If the associated current indicates that none of the chip I/O exhibit leakage, the test may end. However, if the associated current indicates that at least one of the chip I/O has leakage, the tester 205 must then proceed to a second test wherein each chip I/O is individually tested for leakage. This two-part test procedure is performed (as described) each time an I/O Positive Leakage test (i.e., forcing a positive voltage) or an I/O Negative Leakage test (i.e., forcing a negative voltage) is administered.

Pull-Up and Pull-Down Resistor Test

Figure 5:
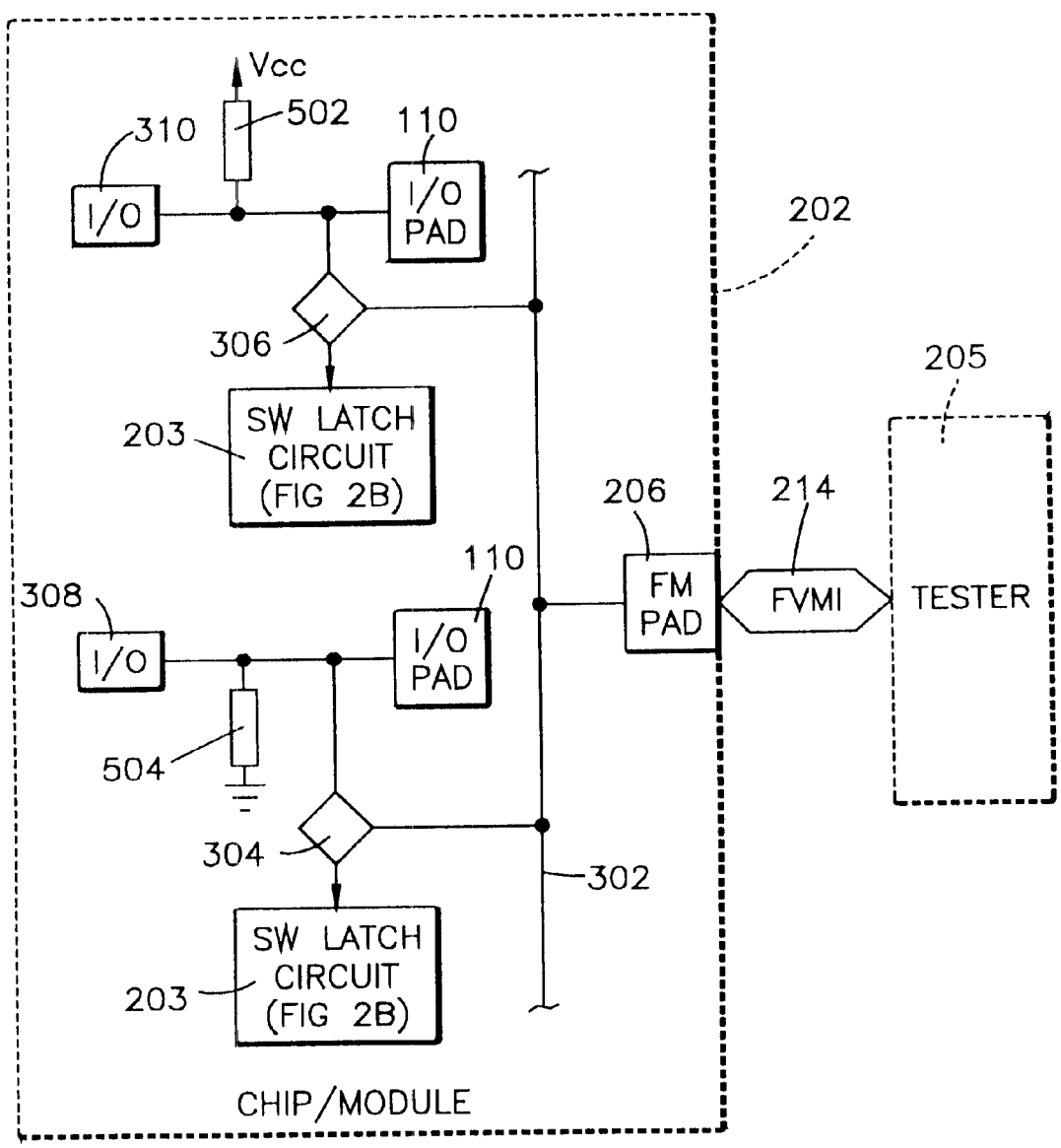
FIG. 5 is a block diagram illustrating a Pull-Up and Pull-Down Resistor test configuration of the present invention.

Illustrated in FIG. 5 is a Pull-Up and Pull-Down Resistor test configuration of the present invention. The physical configuration is similar to that of the Short-Circuit test configuration of FIG. 3 and the I/O Positive and Negative Leakage test configuration FIG. 4, except that the chip I/O have pull-up resistors (e.g., 502) and/or pull-down resistors (e.g., 504).

In operation, the Pull-Up and Pull-Down Resistor test is a two-part test: Pull-Up test and Pull-Down test. Each test is performed in the same manner except for the valve of the forcing voltage applied to the chip I/O. For a Pull-Up test, a voltage less than the pull-up voltage (e.g., supply) is preferable. For a Pull-Down test, a voltage greater than the pull-down voltage (e.g., 0 volts) is preferable.

Accordingly, the test is administered on each chip I/O one at a time until all of the chip I/O have been tested. This is accomplished by setting a switch (e.g., 304) of a particular chip I/O (e.g., 308) to the closed state thereby placing the chip I/O in circuit communication with tester 205. All other switches are placed in the open state thereby disconnecting the remaining chip I/O from tester 205. The tester 205 then forces a voltage through FM True I/O 206, switch bus 302, and switch 304 to resistor 504 and chip I/O 308 and measures the associated current.

If the measured current is within a predetermined threshold range, the pull-up or pull-down resistor, depending on the type of test being administered, is functioning properly. However, if the measured current is not within a predetermined threshold range, the pull-up or pull-down resistor is faulty. In this manner, each resistor of the chip I/O is tested on an individual basis until all of the chip I/O have been tested.

Differential I/O Testing

Figure 6:
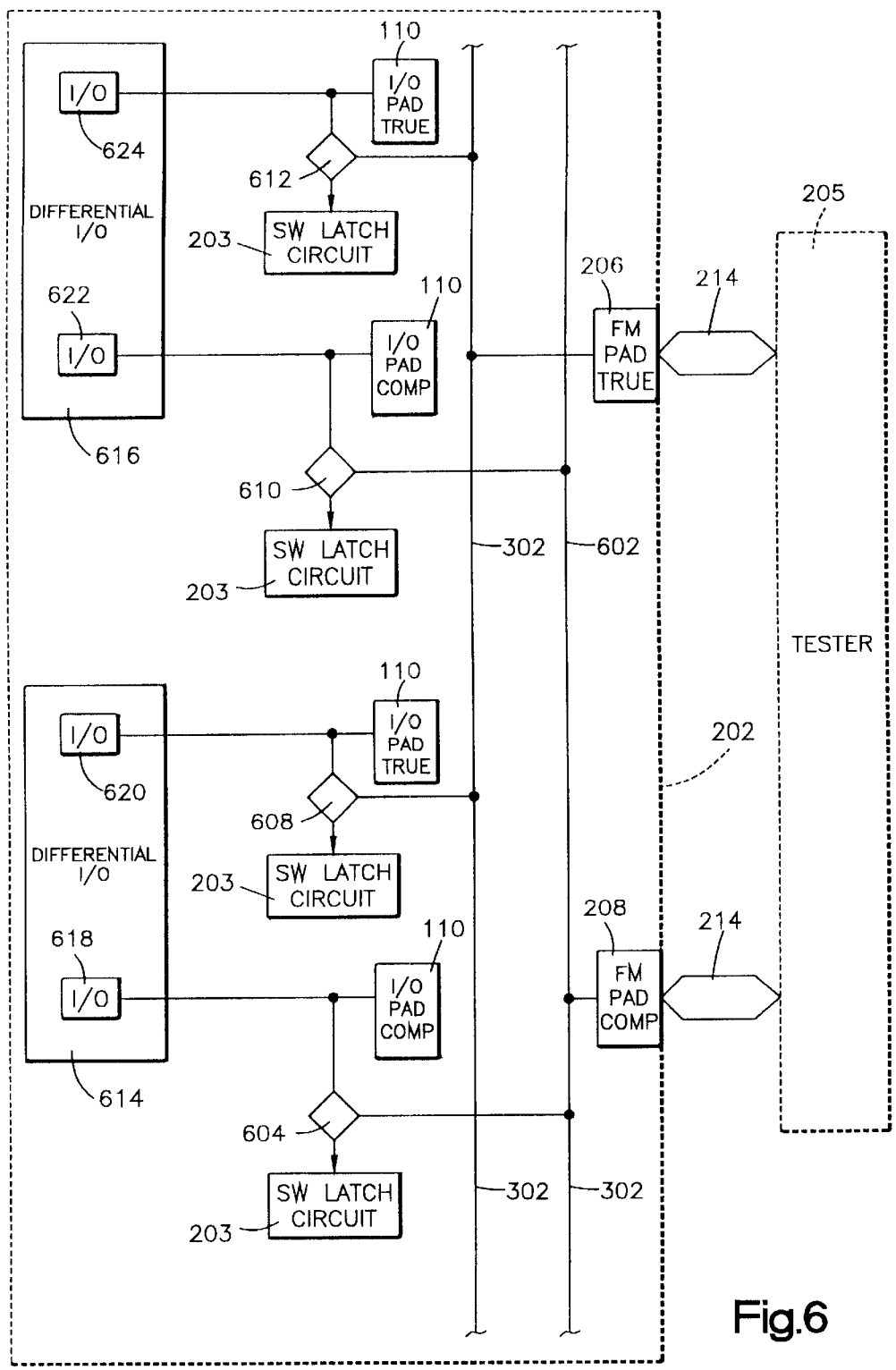
FIG. 6 is a block diagram illustrating a Differential I/O test configuration of the present invention.

Referring now to FIG. 6, a Differential I/O test configuration of the present invention is illustrated. The configuration includes FM True and Complement I/O 206 and 208, respectively, which are in circuit communication with a true switch bus 302 and a complement switch bus 602. The true switch bus 302 is in circuit communication with switches 608 and 612 which are further in circuit communication with true I/Os 620 and 624 of differential I/O circuits 614 and 616. The complement switch bus 602 is similarly configured but is in circuit communication with the complement components of the differential I/O circuits. Specifically, complement switch bus 602 is in circuit communication with switches 604 and 640 which are further in circuit communication with complement I/Os 618 and 622 of differential I/O circuits 614 and 616. As was described earlier, the true switch bus 302 is in circuit communication with every switch associated with a true I/O of each differential I/O circuit. Similarly, the complement switch bus 602 is in circuit communication with every switch associated with a complement I/O of each differential I/O circuit.

So configured, the differential I/O circuits of chip 202 may be tested according to the already described tests: Short-Circuit, Positive and Negative Leakage, and Pull-Up and Pull-Down Resistor. However, each of the following tests must be performed on the true and complement aspects of the differential I/O circuits. For example, the I/O Short-Circuit test as applied to Differential I/Os will be described to illustrate this procedure.

The testing of the true constituents of the differential I/O circuit shall be described first. Specifically, tester 205 inputs switch latch data corresponding to a particular switch (e.g., 608) associated with a true I/O (e.g., 620) to change the state of the switch from an open state to a closed state. With switch 608 in a closed state, FM True I/O 206 is now in circuit communication with true I/O 620 through switch bus 302 and closed switch 608. Since all other switches (e.g., 604, 610, and 612) are in the open state, true I/O 620 is the only chip I/O in circuit communication with tester 205. With such a configuration, after all of the chip I/O drivers are tri-stated (i.e., completely open), tester 205 forces a small current into true I/O 620 and measures the voltage associated with the forced current. Consequently, if the measured voltage associated with the forced current is zero, very nearly zero, or below a predetermined threshold voltage, such measured voltage is indicative of a short-circuit to ground in the true I/O 620. On the other hand, if the measured voltage associated with the forced current is equal to the power supply voltage, or very nearly equal thereto, such measured voltage is indicative of a short-circuit to the supply voltage in the true I/O 620. The same procedure is then performed on true I/O 624 via switch 612 and tester 205 with all other switches disconnecting their respective differential I/O from the tester 205. This procedure is repeated until all of the true I/O of the differential I/O circuits have been tested.

The testing of the complement I/O of the differential I/O circuits of the chip 202 is similar and may be performed concurrently with the testing (described) of the true I/O. Specifically, tester 205 inputs switch latch data corresponding to a particular switch (e.g., 604) associated with a complement I/O (e.g., 618) to change the state of the switch from an open state to a closed state. With switch 604 in a closed state, FM Complement 208 I/O pad is now in circuit communication with complement I/O 618 through switch bus 602 and closed switch 604. Since all other switches (e.g., 608, 610, and 612) are in the open state, complement I/O 618 is the only chip I/O in circuit communication with tester 205. With such a configuration, after all of the chip I/O drivers are tri-stated (i.e., completely open), tester 205 forces a small current into complement I/O 618 and measures the voltage associated with the forced current. Consequently, if the measured voltage associated with the forced current is zero, very nearly zero, or above a predetermined threshold voltage, such measured voltage is indicative of a short-circuit to ground in the differential I/O 620. On the other hand, if the measured voltage associated with the forced current is equal to the complement power supply voltage (including zero), or very nearly equal thereto, such measured voltage is indicative of a short-circuit to the complement supply voltage in the complement I/O 618. The same procedure is then performed on complement I/O 622 via switch 610 and tester 205 with all other switches disconnecting their respective differential I/O from the tester 205. This procedure is repeated until all of the complement I/O of the differential I/O circuits have been tested. It should be noted that order of testing, whether complement or true is first, is not critical. Correspondingly, the Positive and Negative Leakage test and the Pull-Up and Pull-Down Resistor tests may be performed with the circuit structure shown in FIG. 6. Namely, by applying the aforementioned tests to the true and then the complement constituents of the differential I/O circuits, or vice-versa.

Switch Circuit

Figure 7:
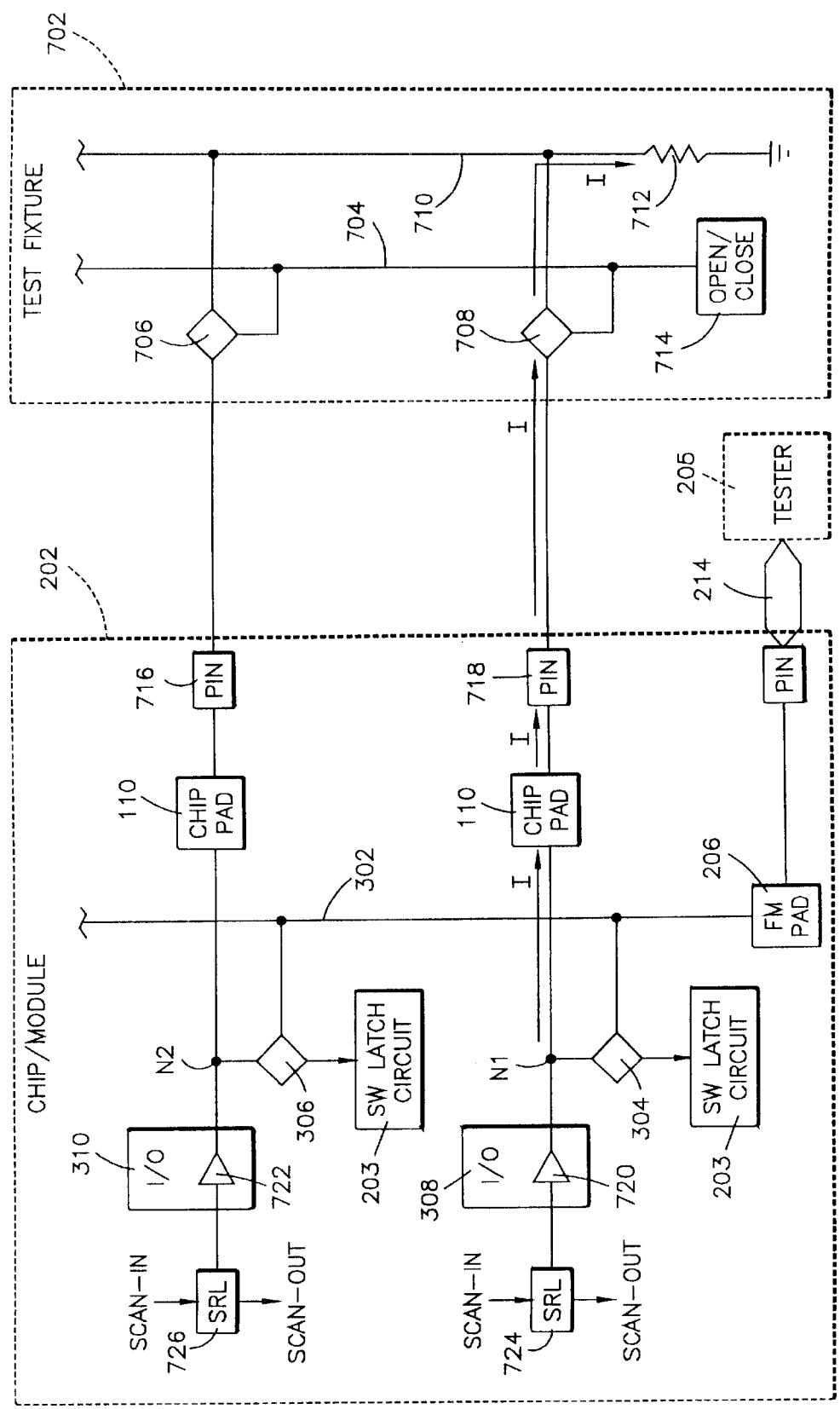
FIG. 7 is a block diagram illustrating a Package test configuration of the present invention.
Figure 8:
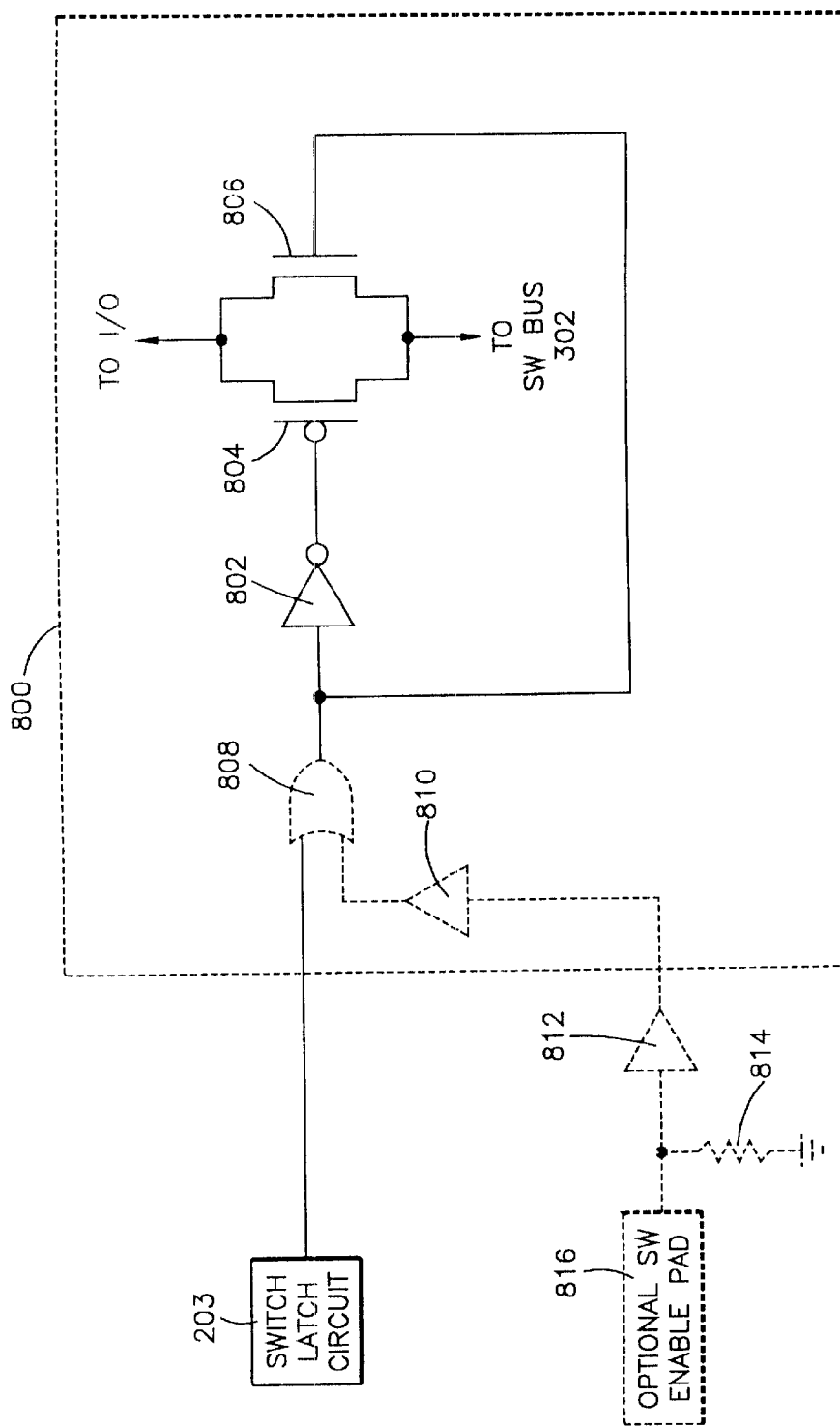
FIG. 8 is a circuit diagram illustrating one embodiment of a switch of the present invention.

Referring now to FIG. 8, a circuit diagram illustrating an embodiment of a switch 800 of the present invention is shown. The switch 800 is the preferred embodiment of the switches shown in FIGS. 2B–7, and 9–13. Switch 800 preferably includes an input from switch latch circuit 203, an inverter 802, PFET 804, and NFET 806. The input from switch latch circuit 203 is connected to the inverter 802 and the gate of NFET 806. The output of inverter 802 is connected to the gate of PFET 804. The drains of PFET 804 and NFET 806 are connected together and further connected to an I/O circuit and pad 110 as shown in FIGS. 2B–7 and 9–13. The sources of PFET 804 and NFET 806 are connected together and further connected to switch bus 302 or 602.

In operation, a logic HI signal from switch latch circuit 203 turns ON PFET 804 and NFET 806 thereby placing the switch bus 302 or 602 in circuit communication with the chip I/O circuit and pad 110. A logic LOW signal from switch latch circuit 203 turns OFF PFET 804 and NFET 806 thereby disconnecting the switch bus 302 from the chip I/O circuit and pad 110. Therefore, the state of the switch latch circuit input determines whether the switch 800 is in the open or closed state.

In an alternative embodiment, switch 800 further includes an optional switch enable input having a pad 816, resistor 814, buffers 812 and 810, and OR gate 808. This embodiment allows for the turning ON and OFF of PFET 804 and on NFET 806 via an external signal input through pad 816. For example, a logic HI signal input on switch pad 816 turns ON PFET 804 and NFET 806. Conversely, a logic LOW level signal input on switch pad 816 turns OFF PFET 804 and NFET 806. Therefore, in the alternative embodiment, PFET 804 and NFET 806 may be turned ON or OFF by way of either input from the switch latch circuit 203 or input via a signal through switch enable pad 816.

The switch geometry is preferably such that the switch is as physically large (e.g., PFET 804 and NFET 806) as a specific ASIC design will allow. However, determination of the size of the switch typically involves a trade-off based on the area required by the ASIC circuits and the total remaining area on the ASIC die. This is sometimes referred to as a trade-off based on an area penalty or requirement. In any event, each switch of the present invention is preferably sized such that it has in internal resistance of about 1 kO and most preferably resides within its respective I/O.

Driver Least Positive Up Level (LPUL) and Most Positive Down Level (MPDL) Test

Figure 9:
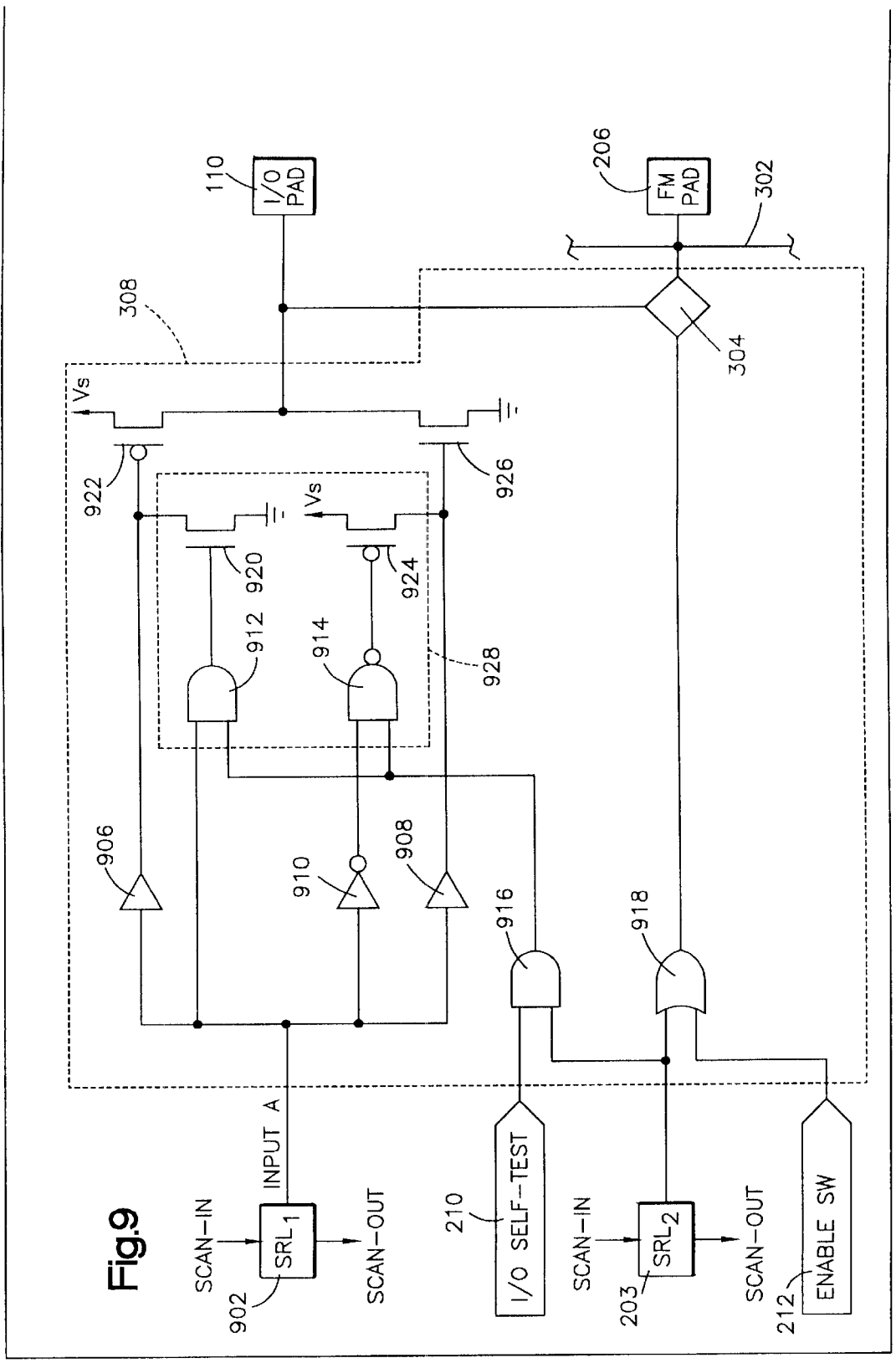
FIG. 9 is a circuit diagram illustrating one embodiment of a Driver Least Positive Up Level (LPUL) and Most Positive Down Level (MPDL) test configuration of the present invention.

Illustrated in FIG. 9 is a first embodiment of an I/O Driver Least Positive Up Level (LPUL) and Most Positive Down Level (MPDL) test configuration. The I/O driver LPUL and MPDL test determines whether the I/O drivers have the required ability to drive an output signal. Specifically, the circuit uses the large PFET 922 and NFET 926 as current sources for each other during the MPDL and LPUL tests, respectively.

The I/O circuit 308 includes an input A generated via a scannable shift-register latch 902. The latch 902 is programmable via the scannable I/O test port (see FIG. 2A). The I/O circuit 308 further includes pre-drivers 906 and 908, inverter driver 910, AND gate 912, NAND gate 914, NFETs 920 and 926 and PFETs 922 and 924, all connected as shown in FIG.

9. The I/O circuit 308 is further connected to an AND gate 916, OR gate 918, and switch 304. Switch 304 is further in circuit communication with switch bus 302 and FM true I/O pad 206. An I/O self-test 210 signal, scannable shift register latch circuit 203, and an Enable Switch 212 signal, are input into AND gate 916 and OR gate 218 as shown.

For a MPDL test, PFET 922 is employed as a current source for the test. Specifically, an MPDL test is performed by administering the following inputs conditions:

TABLE 1

Driver MPDL Test Input Signal

| Signal | Logic State |
| --- | --- |
| A Input | HI |
| I/O Self-Test | HI |
| SRL$_2$ | HI |
| Enable Switch | LOW |

With the inputs defined as above, PFET 922 is partly turned ON, NFETs 920 and 926 are ON, and PFET 924 is OFF. So configured, PFET 922 sources a signal through switch 304 to FM true I/O pad 206 for measurement by the tester 205. The measured value (e.g., voltage) is compared to a predetermined MPDL range to determine whether the output driving capacity of the I/O circuit is acceptable. If the measure value is within the predetermined MPDL range, the I/O circuit's NFET 926 is functioning properly. If the measure value is not within the predetermined MPDL range, NFET 926 is faulty.

For a LPUL test, NFET 926 is employed as a current source for the test. Specifically, an LPUL test is performed by administering the following input conditions:

TABLE 2

Driver LPUL Test Input Signal

| Signal | Logic State |
| --- | --- |
| A Input | LOW |
| I/O Self-Test | HI |
| SRL$_2$ | HI |
| Enable Switch | LOW |

With the inputs defined as above, NFET 926 is partly turned ON, PFETs 922 and 924 are ON, and NFET 920 is OFF. So configured, NFET 926 sources a signal through switch 304 to FM true I/O pad 206 for measurement by the tester 205. The measured value (e.g., voltage) is compared to a predetermined LPUL range to determine whether the output driving capacity of the I/O circuit is acceptable. If the measure value is within the predetermined LPUL range, the I/O circuit's PFET 922 is functioning properly. If the measure value is not within the predetermined LPUL range, PFET 922 is faulty.

Figure 10:
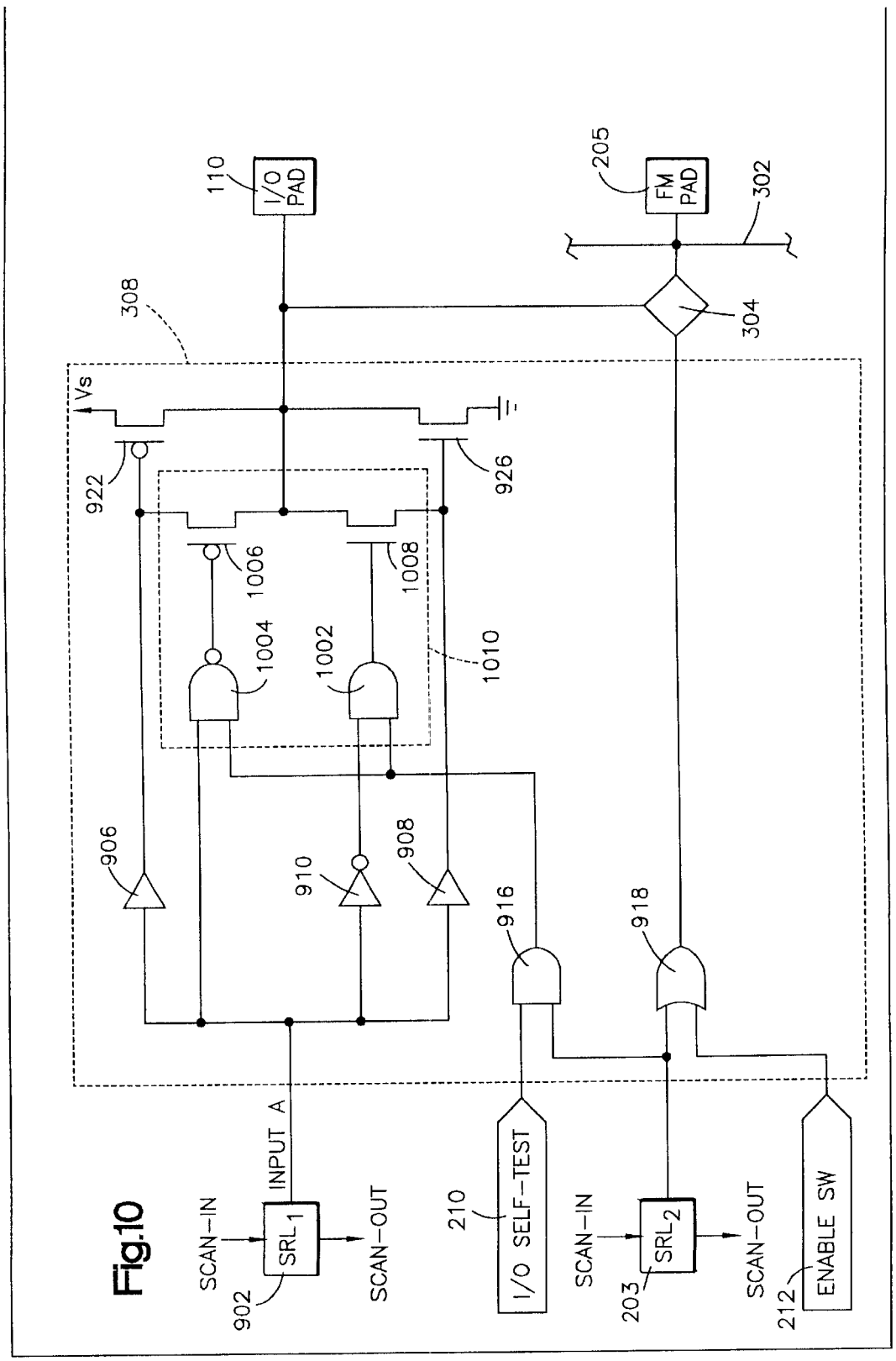
FIG. 10 is a circuit diagram illustrating a second embodiment of a Driver LPUL and MPDL test configuration of the present invention.
Figure 11:
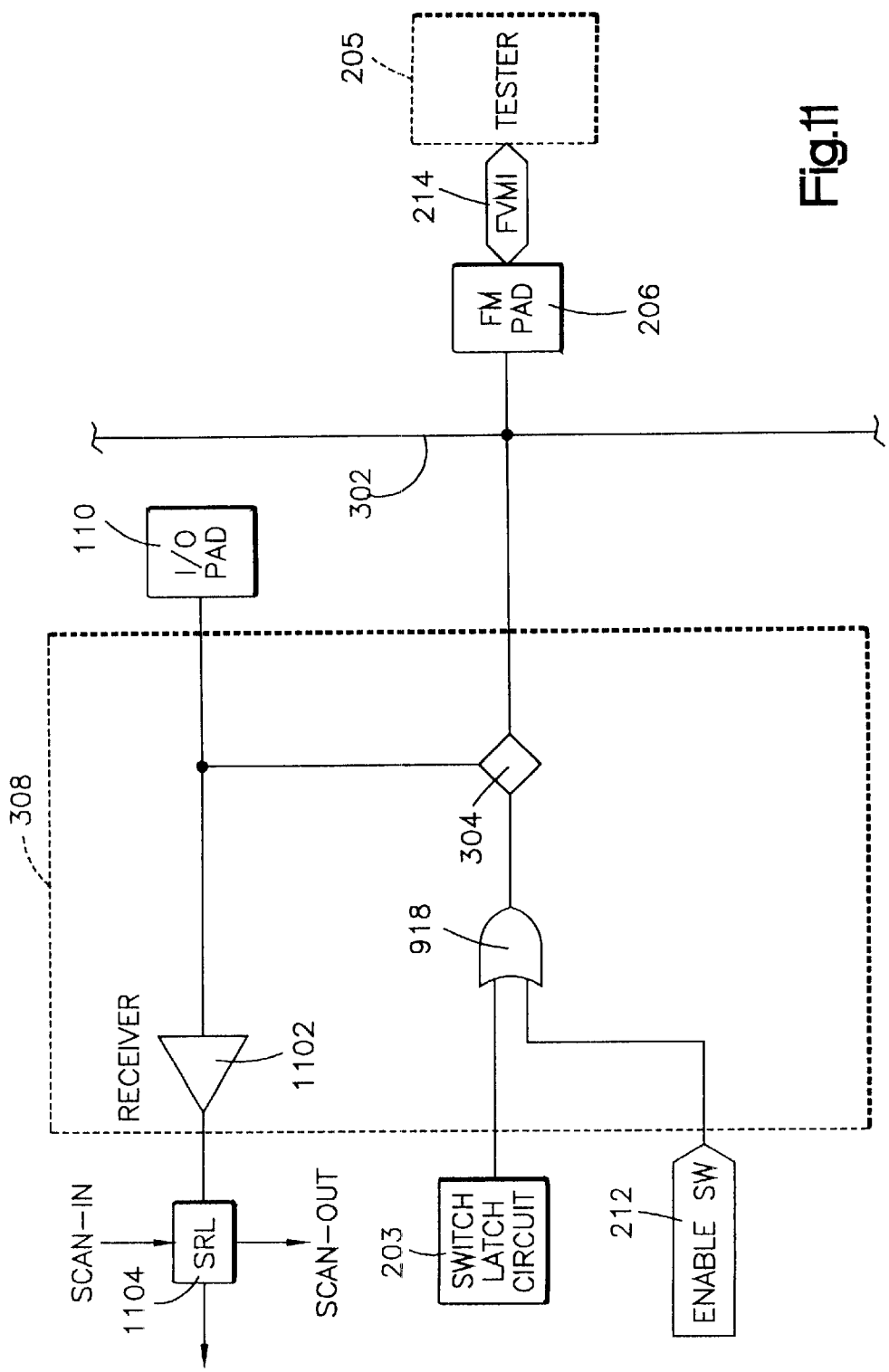
FIG. 11 is a circuit diagram illustrating one embodiment of an I/O Receiver LPUL and MPDL test configuration of the present invention.

Illustrated in FIG. 10 is an alternative embodiment of an I/O Driver Least Positive Up Level (LPUL) and Most Positive Down Level (MPDL) test configuration. Specifically, circuit portion 928 of FIG. 9 may be substituted with circuit portion 1006 of FIG. 10. In this regard, the AND gate 912, NAND gate 914, NFET 920, and PFET 924 of circuit portion 928 of FIG. 9 are replaced with NAND gate 1004, AND gate 1002, PFET 1006, and NFET 1008 of circuit portion 1006 as shown in FIG. 10. The sources of PFETs 1006 and 922 are connected to the drains of NFETs 1008 and 926.

In general, the circuit of FIG. 10 behaves in a manner similar to the circuit of FIG. 9 with the inputs as defined in Tables 1 and 2. For a MPDL test, PFET 922 is employed as a current source for the test. With the inputs defined as in Table 1 above, PFET 922 is partly turned ON, PFETs 1006 and 926 are ON, and NFET 1008 is OFF. So configured, PFET 922 sources a signal through switch 304 to FM true I/O pad 206 for measurement by the tester 205. The measured value (e.g., voltage) is compared to a predetermined MPDL range to determine whether the output driving capacity of the I/O circuit is acceptable. If the measure value is within the predetermined MPDL range, the I/O circuit's NFET 926 is functioning properly. If the measure value is not within the predetermined MPDL range, NFET 926 is faulty.

For a LPUL test, NFET 926 is employed as a current source for the test. With the inputs defined as in Table 2 above, NFET 926 is partly turned ON, PFETs 922 and NFET 1008 are ON, and PFET 1006 is OFF. So configured, NFET 926 sources a signal through switch 304 to FM true I/O pad 206 for measurement by the tester 205. The measured value (e.g., voltage) is compared to a predetermined LPUL range to determine whether the output driving capacity of the I/O circuit is acceptable. If the measure value is within the predetermined LPUL range, the I/O circuit's PFET 922 is functioning properly. If the measure value is not within the predetermined LPUL range, PFET 922 is faulty.

Therefore, an I/O circuit having a first portion and a second portion can use its own internal components to test each other. As described above, this is accomplished by generating a first signal from the first portion of the I/O circuit to test the second portion of the same I/O circuit. Similarly, testing of the first portion is preferably accomplished by generating a second signal from the second portion of the I/O circuit to test the first portion of the same I/O circuit.

I/O Receiver LPUL and MPDL

Figure 12:
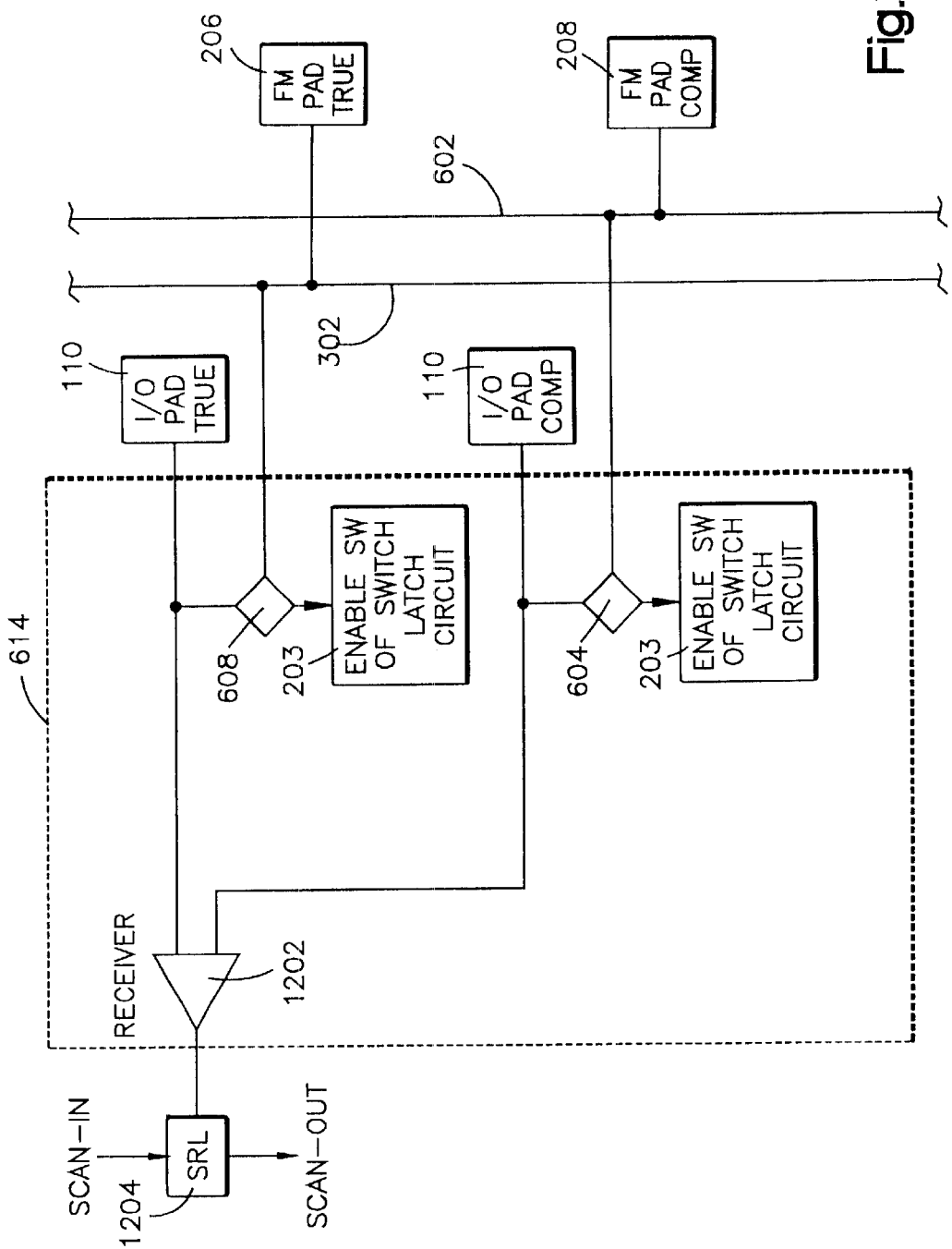
FIG. 12 is a circuit diagram illustrating one embodiment of a Differential I/O Receiver LPUL and MPDL test configuration of the present invention.

Illustrated in FIG. 12 is an embodiment of a single-ended I/O receiver LPUL and MPDL test configuration of the present invention. The I/O receiver LPUL and MPDL test determines whether the I/O receivers have the required ability capability to receive and discriminate between input signals. Specifically, the test configuration forces an input signal (e.g., LPUL voltage; MPDL voltage) into an I/O receiver circuit and measures the receiver output at a scannable shift-register latch. The LPUL voltage and the MPDL voltage signals are predetermined based on the design requirements of the specific I/O being tested.

More specifically, the chip I/O 308 includes a receiver circuit 1102 for receiving input signals which are generally of an analog nature (e.g., analog HI; analog LOW) and outputting a signal of a digital nature. The terms analog HI and analog LOW refer to a range of voltage levels which the receiver circuit 1102 should be able to discriminate as either logic HI or logic LOW signals. The receiver circuit 1102 is in circuit communication with, among other things, scannable shift register latch 1104 and switch 304. As described earlier, the state of switch 304 is controlled by Enable Switch input 212 or Switch Latch circuit 203.

For a LPUL test, tester 205 forces a LPUL voltage signal through FM True pad 206, switch 304, and receiver 1102. The scannable shift-register latch 1104 observes the receiver output (i.e., a logic HI signal under no fault conditions) which is ultimately scanned out of the latch 1104. For example, if the LPUL test range is 2.9–3.3 volts and the receiver output voltage is a logic HI, then the receiver circuit 1102 is functioning properly. For a MPDL test, tester 205 forces a MPDL voltage signal through FM True pad 206, switch 304, and receiver 1102. The scannable shift-register latch 1104 once again observes the receiver output (i.e., a logic LOW signal under no fault conditions) which is ultimately scanned out of the latch 1104. For example, if the MPDL successful test range is 0 to 0.3 volts and the receiver output voltage is a logic LOW, then the receiver circuit 1102 is functioning properly. The LPUL and MPDL tests are performed on every receiver circuit of every chip I/O.

Illustrated in FIG. 12 is an embodiment of a differential I/O receiver LPUL and MPDL test configuration. As described earlier, the I/O receiver LPUL and MPDL test determines whether the I/O receivers have the required ability capability to receive and discriminate between input signals. Specifically, the test configuration forces an input signal (e.g., LPUL voltage; MPDL voltage) into the receiver circuit for each differential input and measures the receiver output at a scannable shift-register latch.

More specifically, the differential chip I/O 614 includes a differential receiver circuit 1202 for receiving differential input signals which are generally of an analog nature (e.g., analog HI and analog LOW for each respective differential input). The receiver circuit 1202 is in circuit communication with, among other things, a scannable shift resister latch 1204 and switches 608 and 604. As described earlier, the state of switches 604 and 608 is controlled by Enable Switch input 212 or Switch Latch circuit 203.

For a LPUL test, tester 205 forces a LPUL voltage through FM True pad 206 and switch 608 to receiver circuit 1202 and a MPDL voltage through FM Complement pad 208 and switch 604 to receiver circuit 1202. The scannable shift-register latch 1204 observes the receiver circuit 1202 output (i.e., a logic HI under no fault conditions) which is ultimately scanned out of the latch 1204. For a MPDL test, tester 205 forces a MPDL voltage through FM True pad 206 and switch 608 to receiver circuit 1202 and a LPUL voltage through FM Complement pad 208 and switch 604 to receiver circuit 1202. The scannable shift-register latch 1204 once again observes the receiver circuit 1202 output (i.e., a logic LOW under no fault conditions) which is ultimately scanned out of the latch 1204. The LPUL and MPDL tests are performed on every differential receiver circuit of every chip I/O.

Differential I/O Terminator Resistor Test

Figure 13:
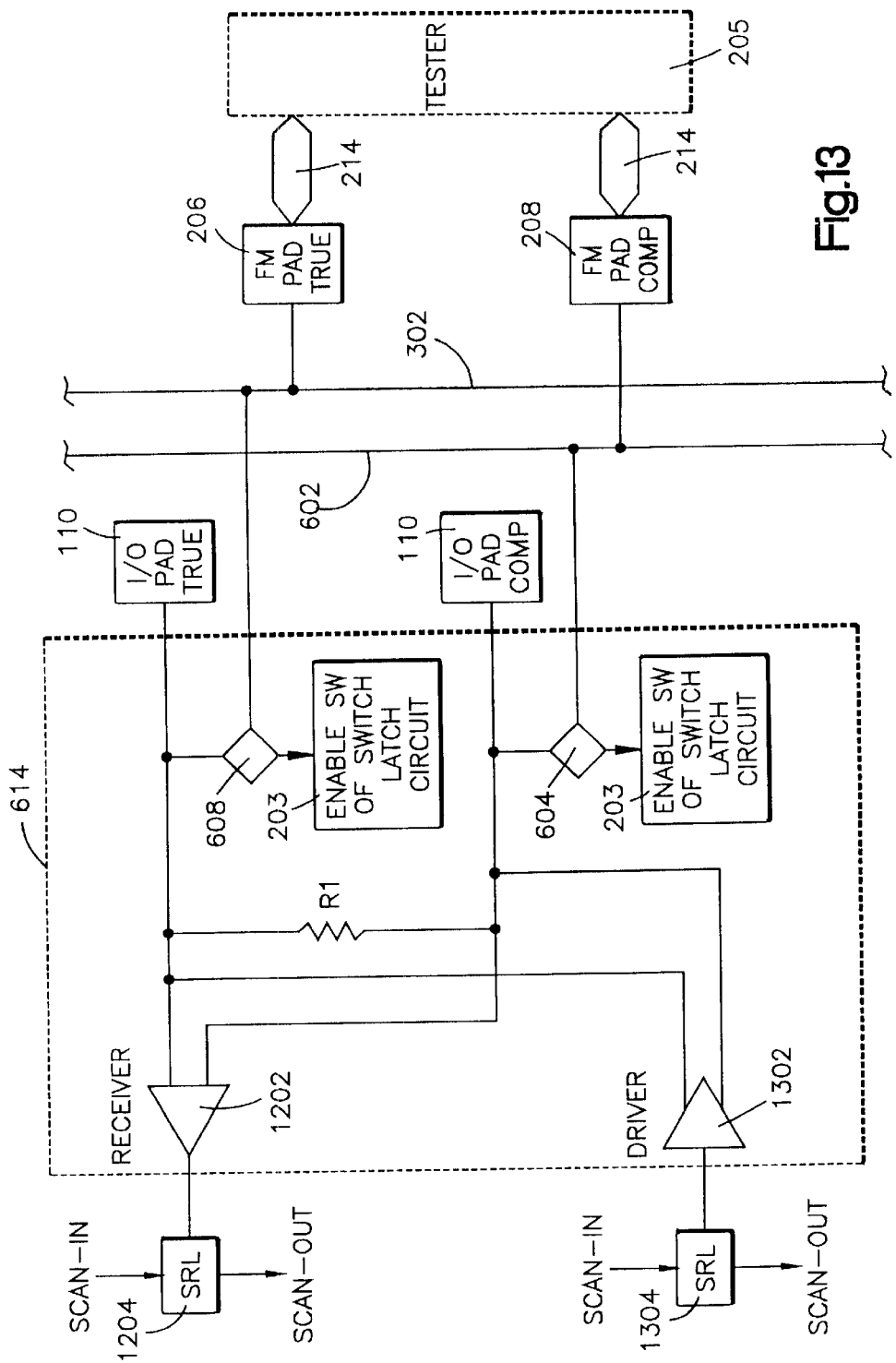
FIG. 13 is a circuit diagram illustrating one embodiment of an Differential I/O Terminator Resistor test configuration of the present invention.

Illustrated in FIG. 13 is an embodiment of a Differential I/O Terminator Resistor Test configuration of the present invention. The test determines whether a resistor R1 positioned across the differential inputs of the I/O circuit is faulty. Specifically, the test configuration forces an input signal (e.g., logic HI; logic LOW) into an I/O receiver circuit and measures the receiver output at a scannable shift-register latch.

In particular, the differential chip I/O 614 includes differential receiver circuit 1202 for receiving differential input signals, a differential driver circuit 1302 for driving differential signal outputs, a termination resistor R1 across the differential inputs of the receiver 1202 and switches 604 and 608. The output of the receiver 1202 is in circuit communication with a first scannable shift-register latch 1204 and the input A of the driver circuit 1303 is in circuit communication with a second scannable shift-register latch 1304. The switches 604 and 608 are in circuit communication with, among other things, the Enable Switch input 212 or the switch latch circuit 203 and switch latch busses 302 and 602 (as shown). The switch latch busses 302 and 602 are in circuit communication with FM True and FM Complement pads 206 and 208, respectively.

The test is administered by (1) forcing input A HI and measuring the corresponding voltage at FM True and Complement pads 206 and 208 (2) forcing input A LOW and measuring the corresponding voltage at FM True and Complement pads 206 and 208, or vice-versa. More specifically, switches 604 and 608 are placed in the closed state and a logic HI signal is forced at the input A of driver circuit 1302. This condition causes driver circuit 1302 to generate a first differential voltage output across resistor R1 which can be measured at the differential I/O pads 110 by tester 205 through closed switches 604 and 608, switch busses 302 and 602, and the FM True and Complement pads 206 and 208. During the second portion of the test, switches 604 and 608 are once again in the closed state and a logic LOW signal is forced at the input A of driver circuit 1302. This condition causes driver circuit 1302 to generate a second differential voltage output across resistor R1 which can be measured at the differential I/O pads 110 by tester 205 through closed switches 604 and 608, switch busses 302 and 602, and the FM True and Complement pads 206 and 208. The measured voltages for each portion of the test are compared to a predetermined range of voltages to determine whether the resistor R1 is faulty.

Package Test

Illustrated in FIG. 7 is a block diagram showing a Package test configuration of the present invention. This test confirms that the chip 202 packaging has been correctly performed. Specifically, the Package test configuration utilizes a test fixture 702 having a plurality of switches (e.g., 706 and 708) connected to a fixture switch bus 704. For each chip I/O, package connection to be tested, there is at least one switch on fixture 702 associated therewith. The fixture switch bus 704 is further connected to an open/close circuit 714 for changing the state of the switches from an open state to a closed state, or vice-versa. The plurality of switches function to either connect or disconnect a plurality of package pins (e.g., 716 and 718) to a fixture ground bus 710 and adjustment resistor 712 (typically less than 1 kO and preferably 0 O). For all of the aforementioned module tests (i.e., an I/O Short-Circuit, I/O Negative and Positive Leakage, a Pull-Up and Pull-Down Resistor, Differential I/O, I/O Driver Least Positive Up Level (LPUL) and Most Positive Down Level (MPDL), a single-ended I/O receiver LPUL and MPDL, Differential I/O receiver LPUL and MPDL, and Differential I/O Terminator Resistor), open/close circuit 714 places all of the switches (e.g., 706 and 708) in the open state. The open/close circuit 714 is required for the Package Pin to Pad test (described below) wherein all of the switches (e.g., 706 and 708) are placed in the closed state. In its most preferable form, open/close circuit 714 is embodied in the test logic of tester 205 which generates a logic signal output having two states: a first representative of an open switch state and a second representative of a closed state.

Package Pin-to-Pad Connectivity Test

The chip 202, when packaged, includes the plurality of pins (e.g., 716 and 718) which are connected to the chip's I/O pads 110. As described earlier, the chip 202 includes a plurality of switches (e.g., 304 and 306) and a switch bus 302. The switches are connected to a switch latch circuit 203. The switch bus 302 is connected to the FM True I/O pad 206. The FM True I/O pad 206 is connected to tester 205 via connections 214. The chip 202 also includes a plurality of scannable shift-register latches (e.g., 724, 726) that are in circuit communication with the chip I/O circuits (e.g., 308, 310). Specifically, each scannable shift-register latch is in circuit communication a driver circuit (e.g., 720, 722) of a particular chip I/O.

So configured, the Package test of the present invention determines whether the wire-bond/C4 package between the chip's I/O pads (e.g., 110) and the associated package pins (e.g., 716 and 718) are properly connected. Specifically, tester 205 inputs switch latch data corresponding to a particular switch (e.g., 304) associated with a chip I/O (e.g., 308) to change the state of the switch from an open state to a closed state. All other switches are placed in the open state. In test fixture 702, the state of open/closed circuit 714 changed to output a close state control signal on fixture switch bus 704 thereby changing the state of all switches (e.g., 706 and 708) to the closed state. So configured, the FM I/O pad 206 is now in electrical communication with adjustment resistor 712 via closed switch 304, chip I/O pad 110, package pin 718, and closed switch 708. A scannable shift-register latch (e.g., 724) is input with a logic HI signal thereby causing I/O driver circuit 720 to force a logic HI at the output (e.g., node N1) of the chip I/O circuit 308. A current "I" then attempts to travel through chip I/O pad 110, package pin 718, closed switch 708, and resistor 712. The tester 205 measures the corresponding voltage at the node N1. A discontinuity in the described circuit (i.e., a fault) results in a voltage whose measurement is outside a predetermined range.

The aforementioned test is performed on one chip I/O at a time. That is, in chip 202, all but one of the switches are in the opened state during the test—the closed switch determining which I/O package connection is being tested. Therefore, the test proceeds by testing each I/O package connection sequentially until all of the I/O package connections have been tested.

In all of the aforementioned test configurations, certain input signals have been noted as being predetermined and certain test results have been described as being based measured signal responses. The specific values, or range of values, attributed to these signals and responses is dependent upon the specific ASIC design (e.g., solid state geometry, material, etc.) and, therefore, may necessarily be different from ASIC to ASIC. Consequently, these predetermined and measure signal values may vary greatly depending on the ASIC being tested. Accordingly, these values are most appropriately determined in view of the specific ASIC design being tested.

While the present invention has been illustrated by the description of embodiments thereof, and while the embodiments have been described in considerable detail, it is not the intention of the applicant to restrict or in any way limit the scope of the appended claims to such detail. Additional advantages and modifications will readily appear to those skilled in the art. For example, the logic shown may be inverted to employ Negative logic, as opposed to Positive logic. Therefore, the invention, in its broader aspects, is not limited to the specific details, the representative apparatus, and illustrative examples shown and described. Accordingly, departures may be made from such details without departing from the spirit or scope of the applicant's general inventive concept.

I claim:

1. A method for testing a chip comprising the steps of:
   (a) providing a plurality of switches on the chip which are associated with a plurality of input/output circuits on the chip;
   (b) selectively changing the state of a predetermined number of the plurality of switches from a first state to a second state,
   (c) applying a test condition to a predetermined number of the plurality of input/output circuits on the chip through the plurality of switches; and
   (d) measuring a resultant condition from the predetermined number of input/output circuits to determine if any of the pre-determined number of input/output circuits on the chip are faulty.

2. The method of claim 1 wherein step (b) comprises the step of inputting switch latch information into an input/output test port on the chip representative of the predetermined number of the plurality of switches to be changed from a first state to a second state.

3. The method of claim 1 wherein step (c) comprises the step of applying a predetermined test voltage to the predetermined number of the plurality of input/output circuits on the chip through the plurality of switches.

4. The method of claim 3 wherein step (d) comprises the step of measuring a resultant current.

5. The method of claim 1 wherein step (c) comprises the step of applying a predetermined test current to the predetermined number of the plurality of input/output circuits on the chip through the plurality of switches.

6. The method of claim 5 wherein step (d) comprises the step of measuring a resultant voltage.

7. A method for performing a short circuit test on input/output circuits on a chip, the method comprising the steps of:
   (a) providing a plurality of switches on the chip which are associated with a plurality of input/output circuits on the chip;
   (b) changing the state of a predetermined switch associated with a predetermined input/output circuit on the chip;
   (c) applying a predetermined current through the predetermined switch to the predetermined input/output circuit on the chip; and
   (d) measuring a resultant voltage through the predetermined switch to determine whether there is a short-circuit in the predetermined input/output circuit on the chip.

8. The method of claim 7 wherein step (b) comprises the step of inputting switch latch information into an input/output test port on the chip representative of the predetermined switch to be changed from a first state to a second state.

9. The method of claim 7 further comprising the step of repeating steps (b)–(d) for every input/output circuit on the chip.

10. A method of performing a negative and positive leakage test on input/output circuits on a chip, the method comprising the steps of:
    (a) providing a plurality of switches on the chip which are associated with a plurality of input/output circuits on the chip;
    (b) placing the plurality of switches in a first state;
    (c) applying a predetermined voltage through the plurality of switches to the plurality of input/output circuits on the chip; and
    (d) measuring a resultant current through the plurality of switches to determine whether there is a positive or negative leakage in the input/output circuits on the chip.

11. The method of claim 10 further comprising the steps of:
    (a) if it is determined that there is leakage in the input/output circuits on the chip, placing a predetermined switch associated with a predetermined input/output circuit in a first state, and
    (b) placing the remaining plurality of switches in a second state.

12. The method of claim 11 further comprising the step of applying a predetermined voltage through the predetermined switch to the predetermined input/output circuit on the chip.

13. The method of claim 12 further comprising the step of measuring a resultant current through the predetermined switch to determine whether there is any leakage in the predetermined input/output circuit on the chip.

14. The method of claim 13 further comprising the steps of repeatedly:
   (a) applying a predetermined voltage through a predetermined switch to a predetermined input/output circuit on the chip; and
   (b) measuring a resultant current through the predetermined switch to determine whether there is any leakage in the predetermined input/output circuit on the chip; until all of the input/output circuits on the chip have been tested for leakage.

15. A method for testing pulling resistors associated with input/output circuits on a chip, the method comprising the steps of:
   (a) providing a plurality of switches on the chip which are associated with a plurality of pulling resistors and input/output circuits on the chip;
   (b) selectively changing the state of a predetermined switch associated with a pulling resistor of a predetermined input/output circuit on the chip;
   (c) applying a predetermined voltage through the predetermined switch to the pulling resistor of the predetermined input/output circuit on the chip; and
   (d) measuring a resultant current through the predetermined switch to determine whether the pulling resistor of the predetermined input/output circuit is faulty.

16. The method of claim 15 wherein step (b) comprises the step of inputting switch latch information into an input/output test port on the chip representative of the predetermined switch to be changed from a first state to a second state.

17. The method of claim 15 further comprising the step of repeating steps (b)–(d) for pulling resistors of every input/output circuit on the chip.

18. A method of performing a functional parametric test on input/output circuits on a chip, the method comprising the steps of:
   (a) providing a plurality of switches on the chip which are associated with a plurality of input/output circuits on the chip;
   (b) selectively changing the state of a predetermined switch associated with a predetermined input/output circuit on the chip;
   (c) generating a current by turning on a first transistor of a complementary transistor driver stage of the predetermined input/output circuit on the chip;
   (d) at least partially turning on a second transistor of the complementary transistor driver stage of the predetermined input/output circuit on the chip; and
   (e) measuring a resultant voltage through the predetermined switch to determine whether the functional parametric test of the predetermined input/output circuit on the chip was successful.

19. The method of claim 18 further comprising the steps of:
   (a) generating current by turning on the second transistor of the complementary transistor driver stage of the predetermined input/output circuit on the chip; and
   (b) at least partially turning on the first transistor of the complementary transistor driver stage of the predetermined input/output circuit on the chip.

20. The method of claim 19 wherein the step of generating current by turning on the second transistor of the complementary transistor driver stage of the predetermined input/output circuit on the chip comprises the step of driving the gate of a PFET transistor to a logic LOW level.

21. The method of claim 18 wherein step (c) comprises the step of driving the gate of an NFET transistor to a logic HI level.

22. The method of claim 18 wherein steps (b), (c), (d), and (e) are performed for each input/output circuit on the chip.

23. The method of claim 22 wherein step (b) comprises the step of inputting switch latch information into an input/output test port on the chip representative of the predetermined switch.

24. The method of claim 22 further comprising the step of repeating steps (b)–(d) for every input/output circuit on the chip.

25. A method for testing differential input/output circuits on a chip, the method comprising the steps of:
   (a) providing a plurality of switches on the chip which are associated with a plurality of differential input/output circuits on the chip;
   (b) changing the state of a predetermined switch associated with a predetermined differential input/output circuit;
   (c) applying a predetermined current through the predetermined switch to the predetermined differential input/output circuit; and
   (d) measuring a resultant voltage through the predetermined switch to determine if the predetermined differential input/output circuit is faulty.

26. The method of claim 25 further comprising the step of applying a predetermined voltage through the predetermined switch to the predetermined differential input/output circuit.

27. The method of claim 26 further comprising the step of measuring a resultant current through the predetermined switch to determine if the predetermined differential input/output circuit is faulty.

28. A method for testing an integrated circuit package having a chip die, a plurality of pads on the chip die, and a plurality of pins associated with the plurality of pads, the method comprising the steps of:
   (a) providing a plurality of switches on the chip which are associated with the plurality of pads;
   (b) changing the state of a predetermined switch associated with a predetermined pad;
   (c) applying a predetermined current through the predetermined switch to the predetermined pad; and
   (d) measuring a resultant voltage through the predetermined switch to determine if the package is faulty.

* * * * *